United States Patent [19]
Yoshida

[11] Patent Number: 5,566,126
[45] Date of Patent: Oct. 15, 1996

[54] MOS STATIC MEMORY DEVICE INCORPORATING MODIFIED OPERATION OF SENSE AMPLIFIER AND TRANSFER GATE

[75] Inventor: Makoto Yoshida, Nara, Japan

[73] Assignee: Sharp Kabushiki Kaisha, Osaka, Japan

[21] Appl. No.: 303,329

[22] Filed: Sep. 9, 1994

[30] Foreign Application Priority Data

Dec. 3, 1993 [JP] Japan .................................. 5-304281

[51] Int. Cl.⁶ .................................................. G11C 7/00
[52] U.S. Cl. ............................................ 365/190; 365/208
[58] Field of Search ...................................... 365/190, 208, 365/207, 233, 205

[56] References Cited

U.S. PATENT DOCUMENTS

| | | | |
|---|---|---|---|
| 4,563,754 | 1/1986 | Aoyama | 365/190 |
| 4,829,483 | 5/1989 | Ogihara | 365/190 |
| 4,980,863 | 12/1990 | Ogihara | 365/190 |
| 5,038,324 | 8/1991 | Oh | 365/190 |
| 5,228,106 | 7/1993 | Ang | 365/208 |
| 5,369,622 | 11/1994 | McLaury | 365/190 |

FOREIGN PATENT DOCUMENTS

| | | |
|---|---|---|
| 63-128662 | 6/1988 | Japan . |
| 63-138598 | 6/1988 | Japan . |
| 2-244756 | 9/1990 | Japan . |

OTHER PUBLICATIONS

Sasaki et al., "A 23-ns 4-Mb CMOS SRAM with 0.2 µA standby current" *IEEE Journal of Solid-State Circuits* (1990) 25(5):1075–1081. This publication is also cited on p. 1, lines 19–22 of the application as originally filed.

*Primary Examiner*—A. Zarabian
*Attorney, Agent, or Firm*—Morrison & Foerster

[57] ABSTRACT

A MOS static memory device is provided in which transfer gates are connected between a bit line and one terminal of a sense amplifier and between a bit-bar line and the other terminal of the sense amplifier, respectively. The bit line and the bit-bar line are thereby separated from the sense amplifier during the read sensing. In addition, the sensing by the sense amplifier is started after the transfer gates are turned OFF, whereby the amount of potential change of the bit line and the bit-bar line is prevented from increasing. As a result, in a read operation, only a small potential difference is generated between the bit line and the bit-bar line in accordance with the stored contents of the memory cell, and little current for charge and discharge flows. Alternatively, the transfer gates are constructed in such a manner that first transfer gates with a lower ON resistance and second transfer gates with a relatively high ON resistance are connected in parallel. Due to this construction, during the ON period of the second transfer gates, the bit line and the bit-bar line are slightly supported by the sense amplifier. Accordingly, it is possible to obtain a sense amplifier occupying a smaller area and having a strong resistance against the bit-line interference.

7 Claims, 9 Drawing Sheets

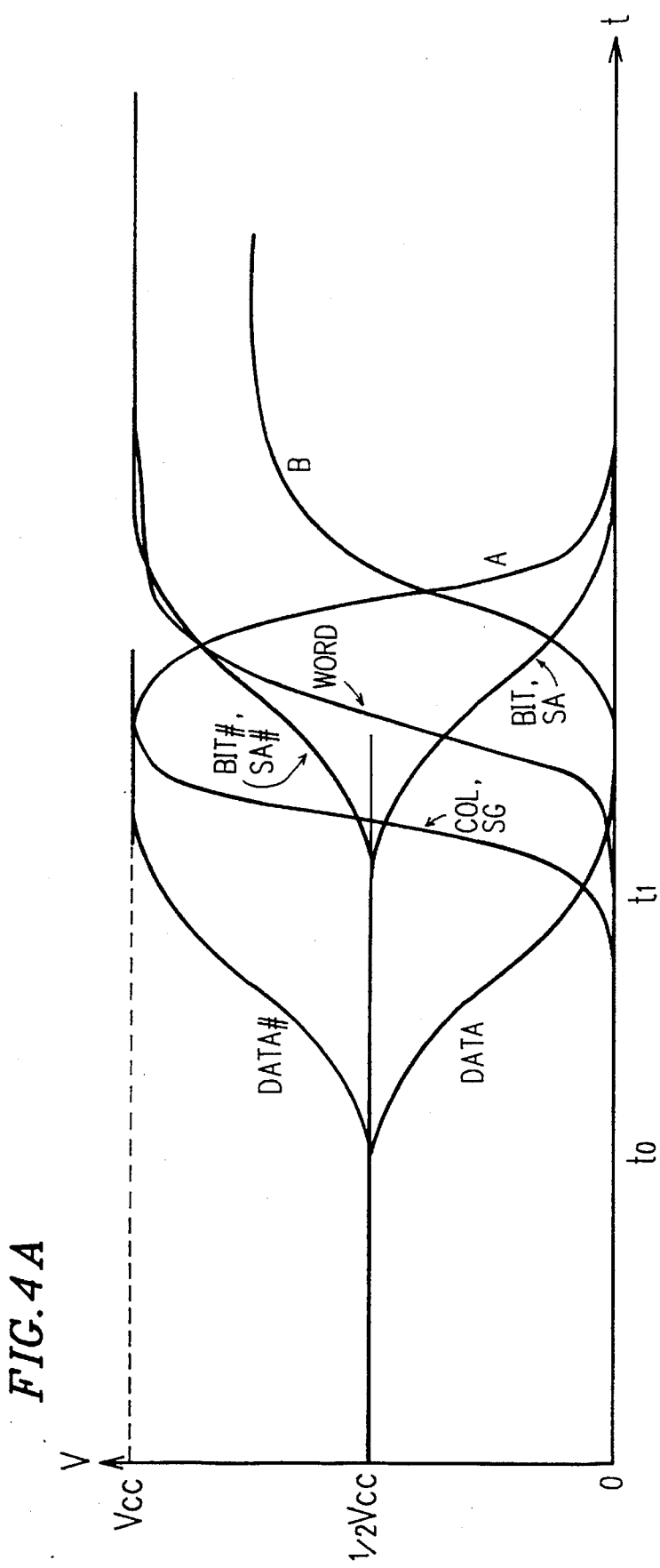

5,566,126

MOS STATIC MEMORY DEVICE INCORPORATING MODIFIED OPERATION OF SENSE AMPLIFIER AND TRANSFER GATE

BACKGROUND OF THE INVENTION

1. Field of the Invention:

The present invention relates to a MOS static memory device with a read/write circuit.

2. Description of the Related Art:

As the capacity of a static random access memory (SRAM) has been increased from 1 Megabit to 4 Mbits and further to 16 Mbits in recent years, the chip size has been made larger. Accordingly, longer wirings are required for transmitting data, and hence it takes a longer time to transmit data. In order to shorten the data transmission time, such a large-capacity SRAM has been provided with local sense amplifiers disposed in the vicinity of a memory array. Each local sense amplifier amplifies a signal and outputs the amplified signal to the external circuitry. An example of such an SRAM is described in IEEE JOURNAL OF SOLID-STATE CIRCUITS, VOL. 25, NO. 5, OCTOBER 1990, pp. 1075–1081, "A 23-ns 4-Mb CMOS SRAM with 0.2-µA Standby Current" (hereinafter referred to as Reference 1). In Reference 1, local sense amplifiers each consisting of 16 transistors are located in the vicinity of the memory array.

On the other hand, the information stored in memory cells tends to be destroyed because of a decrease in operating voltage of the SRAM and because of the increase of interference between bit lines due to the floating capacitance in association with an increase in capacity (hereinafter such phenomenon is referred to as a memory destruction). As a counter-measure against memory destruction, Japanese Laid-Open Patent Publication No. 63-128662 (hereinafter referred to as Reference 2) discloses an example in which a small potential difference appearing on bit lines is reproduced by a flip-flop type sense amplifier and the data is rewritten, so that data destruction is prevented. The sense amplifier used in Reference 2 consists of only six transistors.

However, in the above-mentioned method applied to the conventional memory device in which sense amplifiers are disposed at local positions, the sense amplifiers are disposed on each side of the memory array. This method necessarily requires a large chip area.

For example, FIG. 1 schematically shows the construction of a 4-Mbits SRAM chip 100 in Reference 1. The memory cell array of the SRAM chip 100 is divided into 64 sub-arrays. Each sub-array is composed of 1024 rows and 64 columns. Each of areas 101 and 102 in FIG. 1 includes two sub-arrays. Area 103 includes a word decoder for the four sub-arrays existing in the areas 101 and 102. Area 104 along one longer side of the SRAM chip 100 includes a column decoder. Area 105 which is adjacent to the area 104 (i.e., adjacent to the column decoder) includes local sense amplifiers. The area 105 in which the local sense amplifiers are provided necessitates a relatively large area. Specifically, the area 105 occupies about 4% of the entire area of the SRAM chip 100.

On the other hand, the flip-flop type sense amplifier used in Reference 2 is composed of the six transistor elements, and moreover, two of them can be combined into one unit. Therefore, in terms of the area to be required, Reference 2 is considerably advantageous as compared to the SRAM chip 100 in Reference 1. However, if the bit-line potential is reproduced by the flip-flop type sense amplifier as disclosed in Reference 2, the potential of the bit line is changed in a possible full-scale (referred to as "being fullswung"). As a result, a very large current for charge and discharge flows through the bit line. The current I is expressed as follows:

$$I = C \times V \times F \times N \quad \ldots \quad (1)$$

where C denotes a capacitance of a bit line, F denotes the number of times of charge and discharge per second, i.e., the operating frequency, V denotes an amount of voltage change of the bit line, and N denotes the number of bit-line pairs which synchronously operate.

For example, when C=3 pF, V=3.3 V, F=10 MHz, and N=128, the current I is estimated to be 12.7 mA. That is, a large current flows through the bit lines.

SUMMARY OF THE INVENTION

The MOS static memory device of this invention includes: a bit-line pair to which a memory cell is connected, the bit-line pair including a bit line and a bit-bar line; a sense amplifier; a data bus and a data-bar bus; first transfer gates respectively provided between a first terminal of the sense amplifier and the bit line and between a second terminal of the sense amplifier and the bit-bar line; second transfer gates respectively provided between the first terminal of the sense amplifier and the data bus and between the second terminal of the sense amplifier and the data-bar bus; and control means connected to the first transfer gates and the second transfer gates for controlling the operation thereof whereby during a read operation of the MOS static memory device, the sense amplifier starts a sensing operation after the first transfer gates are turned OFF.

According to another aspect of the invention, the MOS static memory device includes: a bit-line pair to which a memory cell is connected, the bit-line pair including a bit line and a bit-bar line; a sense amplifier; a data bus and a data-bar bus; parallel circuits respectively including a first transfer gate with a low ON resistance and a second transfer gate with a high ON resistance, the parallel circuits being provided respectively between a first terminal of the sense amplifier and the bit line and between a second terminal of the sense amplifier and the bit-bar line; third transfer gates respectively provided between the first terminal of the sense amplifier and the data bus and between the second terminal of the sense amplifier and the data-bar bus; and control means connected to the first transfer gates, the second transfer gates and the third transfer gates for controlling the operation thereof whereby during a read operation of the MOS static memory device, the sense amplifier starts a sensing operation after the respective first transfer gates are turned OFF.

Thus, the invention described herein makes possible the advantage of providing a MOS static memory device using sense amplifiers which requires only a small area and operates with a low power consumption.

This and other advantages of the present invention will become apparent to those skilled in the art upon reading and understanding the following detailed description with reference to the accompanying figures.

BRIEF DESCRIPTION OF THE DRAWINGS

FIGS. 4A and 4B are timing diagrams showing a write operation of the MOS static memory device shown in FIG. 2.

DESCRIPTION OF THE PREFERRED EMBODIMENTS

The present invention will now be described by way of illustrative examples.

Example 1

Figure 2:
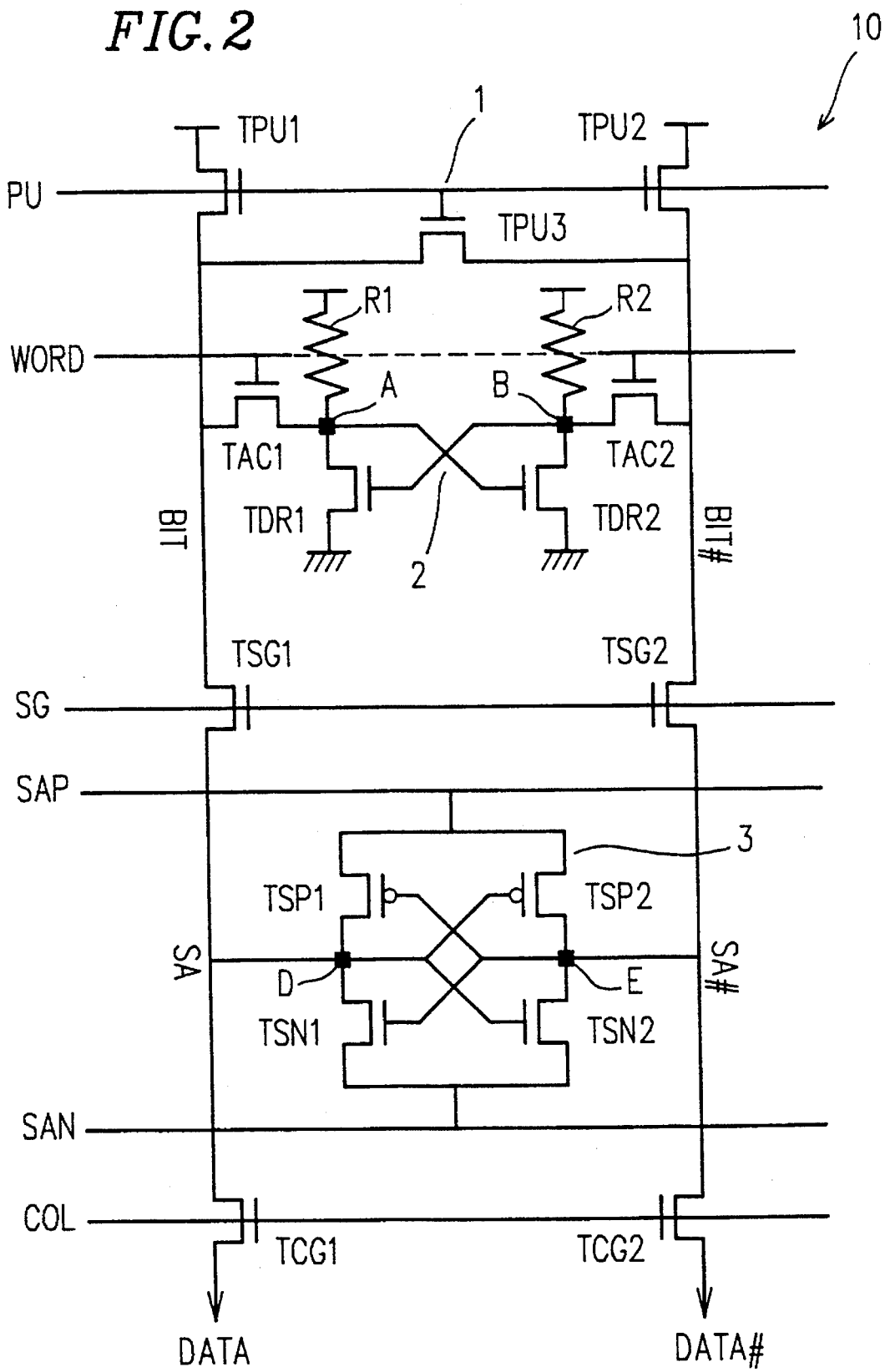
FIG. 2 is a circuit diagram of a MOS static memory device in accordance with a first example of the invention.

FIG. 2 is a circuit diagram of a MOS static memory device 10 in accordance with a first example of the invention.

The memory device 10 includes a precharge circuit 1, which includes three transistors TPU1, TPU2, and TPU3, and which is controlled by a precharge signal line PU.

A memory cell 2 includes resistors R1 and R2, transistors TDR1 and TDR2, and access transistors TAC1 and TAC2. A node A, at which the resistor R1 is connected to the transistor TDR1, is connected to the gate of the transistor TDR2. Similarly, a node B, at which the resistor R2 is connected to the transistor TDR2, is connected to the gate of the transistor TDR1. The resistors R1 and R2 and the transistors TDR1 and TDR2 constitute a flip-flop circuit, in which the transistors TDR1 and TDR2 function as drivers. The access transistors TAC1 and TAC2 are provided between a bit line BIT and the node A and between a bit-bar line BIT# and the node B, respectively. The gates of respective access transistors TAC1 and TAC2 are connected to a word line WORD.

A sense amplifier 3 includes two NMOS transistors TSN1 and TSN2 and two PMOS transistors TSP1 and TSP2. The drain of transistor TSN1 is connected to a transfer gate TSG1 for the bit line BIT via a sense line SA. The gate of transistor TSN1 is connected to a transfer gate TSG2 for the bit-bar line BIT# via a sense-bar line SA#. The source of transistor TSN1 is connected to a sense control line SAN. In a similar way, the drain of transistor TSN2 is connected to the transfer gate TSG2 for the bit-bar line BIT# via the sense-bar line SA#. The gate of transistor TSN2 is connected to the transfer gate TSG1 for the bit line BIT via the sense line SA. The source of transistor TSN2 is connected to the sense control line SAN.

The drain of transistor TSP1 is connected to the transfer gate TSG1 for the bit line BIT via the sense line SA. The gate of transistor TSP1 is connected to the transfer gate TSG2 for the bit-bar line BIT# via the sense-bar line SA#. The source of transistor TSP1 is connected to a sense control line SAP. Similarly, the drain of transistor TSP2 is connected to the transfer gate TSG2 for the bit-bar line BIT# via the sense-bar line SA#. The gate of transistor TSP2 is connected to the transfer gate TSG1 for the bit line BIT via the sense line SA. The source of transistor TSP2 is connected to the sense control line SAP.

The transfer gate TSG1 for the bit line BIT is connected to data bus DATA via the sense line SA and a column transfer gate TCG1. The transfer gate TSG2 for the bit-bar line BIT# is connected to data-bar bus DATA# via the sense-bar line SA# and a column transfer gate TCG2.

A node D, at which the transistors TSP1 and TSN1 are connected, constitutes one terminal of the sense amplifier 3. Similarly, a node E, at which the transistors TSP2 and TSN2 are connected, constitutes the other terminal of the sense amplifier 3.

Moreover, a control line SG is connected to each of the gates of the transfer gates TSG1 and TSG2. A control line COL is connected to each of the gates of the column transfer gates TCG1 and TCG2.

The operation of the MOS static memory device 10 having the above-described structure in the first example will now be described.

Figure 3:
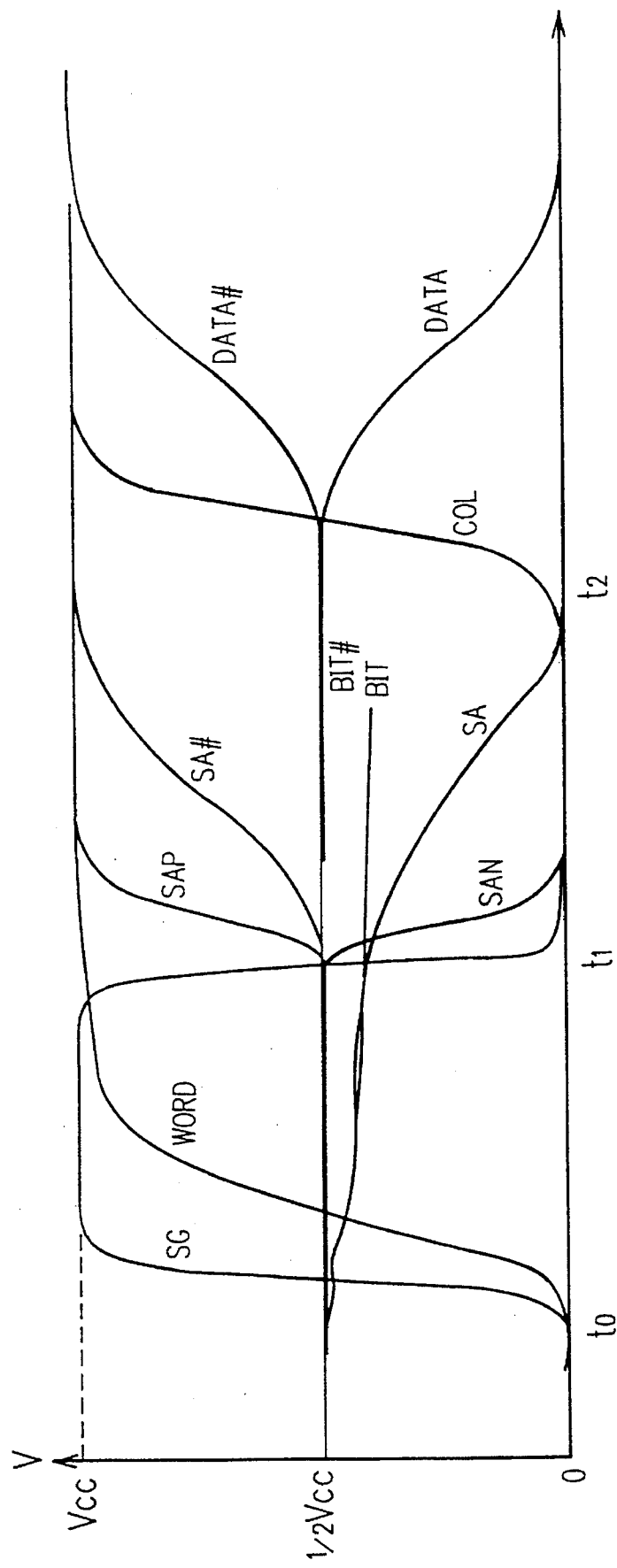
FIG. 3 is a timing diagram showing a read operation of the MOS static memory device shown in FIG. 2.

Referring to the timing diagram shown in FIG. 3, a read operation is first described. Lines in FIG. 3 are correspondingly labelled to indicate variations in potential of the respective lines and buses included in the circuit shown in FIG. 2 along a time axis. For example, a line indicated by SG shows the variation in potential of the control line SG.

First, at $t=t_0$, the potential of the control line SG is driven to rise to $V_{cc}$, and also the potential of the word line WORD is driven to rise toward $V_{cc}$. As a result, the access transistors TAC1 and TAC2 are turned ON so that a potential difference is generated between the bit line BIT and the bit-bar line BIT# in accordance with data stored in the memory cell 2. At this time, the transfer gates TSG1 and TSG2 between the bit line BIT and the sense amplifier 3 and between the bit-bar line BIT# and the sense amplifier 3, respectively, are both in the ON state. The potentials of the sense control lines SAP and SAN and the potentials of the sense lines SA and SA# are set to be at ½ $V_{cc}$. Because the potential difference between the sense lines SA and SA# is not sufficient to be accurately sensed, the sense amplifier 3 does not start its sensing operation yet.

After a short time, when the potential difference between the sense lines SA and SA# becomes sufficient for sensing, the potential of the control line SG is lowered to GND (V=0) at $t=t_1$. As a result, the transfer gates TSG1 and TSG2 are turned OFF, so that the potential of the sense control line SAP and the potential of the sense control line SAN gradually change to $V_{cc}$ and GND, respectively. Then, the sense amplifier 3 starts its operation. At this time, the transfer gates TSG1 and TSG2 are in the OFF state, so that the potentials of the bit line BIT and the bit-bar line BIT# still exhibit the potential difference caused by the memory cell 2.

When the sensing operation by the sense amplifier 3 is finished and the potential difference between the sense lines SA and SA# at both ends of the sense amplifier 3 becomes sufficiently large, the potential of the control line COL is driven to rise to $V_{cc}$ at $t=t_2$. Thus, the column transfer gates TCG1 and TCG2 are turned ON. As a result, a data signal is superimposed on the data bus DATA and the data-bar bus DATA#, so that the potentials of the data buses are caused to change.

As described above, in the MOS static memory device 10 shown in FIG. 2, the transfer gates TSG1 and TSG2 are provided between the bit line BIT and the sense amplifier 3 and between the bit-bar line BIT# and the sense amplifier 3, respectively, whereby the bit line BIT and the bit-bar line BIT# are separated from the sense amplifier 3 during the read sense operation. In addition, the sense amplifier 3 starts its sensing operation after the transfer gates TSG1 and TSG2 are turned OFF, so that the amount of the potential change of the bit line BIT is prevented from being large. As a result, in the above-mentioned read operation, only a small potential difference in accordance with the stored data in the memory cell 2 is generated between the bit line BIT and the bit-bar line BIT#, and little current for charge and discharge flows.

The bit line BIT and the bit-bar line BIT# are not driven under a low impedance condition. Therefore, in order to attain a sufficient effect against the memory destruction by using the circuit shown in FIG. 2, various countermeasures are desired. Such countermeasures include that the cell ratio is increased, the memory cell 2 itself is made to have a resistance against memory destruction, and a pull-up device of the bit line BIT is turned ON during the read period.

Figure 4B:
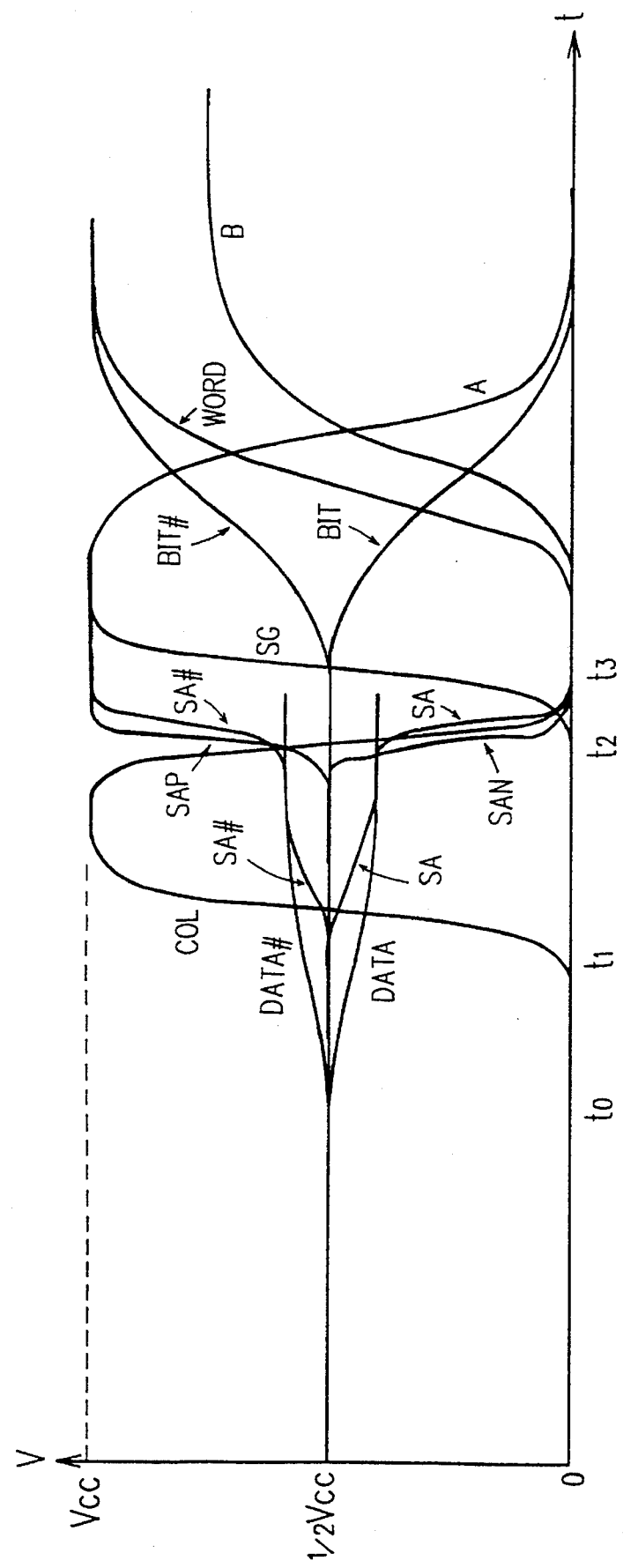

Next, referring to the timing diagrams shown in FIGS. 4A and 4B, a write operation will be described. Lines in the figures are again correspondingly labelled to indicate variations in potential of the respective lines and buses included in the circuit shown in FIG. 2, similarly as in FIG. 3. Further, lines labelled as A and B in the figures indicate variations in potential at the nodes a and B shown in FIG. 2, which are changed as data is written into the memory cell 2.

The write operation can be achieved without using the sense amplifier 3. First referring to the timing diagram shown in FIG. 4A, at t=t_0, the potentials of the data bus DATA and the data-bar bus DATA# are made to full-swing. Next, at t=t_1, the potentials of the control lines COL and SG are driven to rise toward $V_{cc}$, so that the transfer gates TSG1 and TSG2, and the column transfer gates TCG1 and TCG2 are simultaneously turned ON. Then, the word line WORD is activated and the write operation is performed as indicated by the potential changes at the nodes A and B.

However, when the sense amplifier 3 is operated, the write operation can be performed faster with lower power consumption. Referring to FIG. 4B, the low-power write operation will be described below.

At t=t_0, a small potential difference in accordance with data to be stored is superimposed on the data bus DATA and the data-bar bus DATA#. Next, at t=t_1, the potential of the control line COL is driven to rise toward $V_{cc}$, so that the column transfer gates TCG1 and TCG2 are turned ON. As a result, the data are fed onto the sense line SA and the sense-bar line at both ends of the sense amplifier 3, so that the potentials of the lines SA and SA# are caused to slightly change.

Next, when the potential difference between the sense line SA and the sense-bar line SA# at both ends of the sense amplifier 3 becomes sufficiently large for sensing (t=t_2), the potential of the control line COL is driven to decrease toward GND, so that the column transfer gates TCG1 and TCG2 are turned OFF. As a result, the potential of the sense control line SAP and the potential of the sense control line SAN are changed to $V_{cc}$ and GND, respectively. Then, the sensing operation of the sense amplifier 3 is started.

When the sensing operation is finished and the sufficiently large potential difference is produced at both ends of the sense amplifier 3 (t=t_3), the transfer gates TSG1 and TSG2 are turned ON, and the bit line BIT and the bit-bar line BIT# are driven. Then, the word line WORD is activated, whereby the writing to the memory cell 2 is performed as indicated by the potential changes at the nodes A and B.

According to the above-explained method, the amount of the potential change of the data bus DATA and the data-bar bus DATA# is not so large, whereby the data can be written faster with lower power consumption.

Example 2

Figure 5:
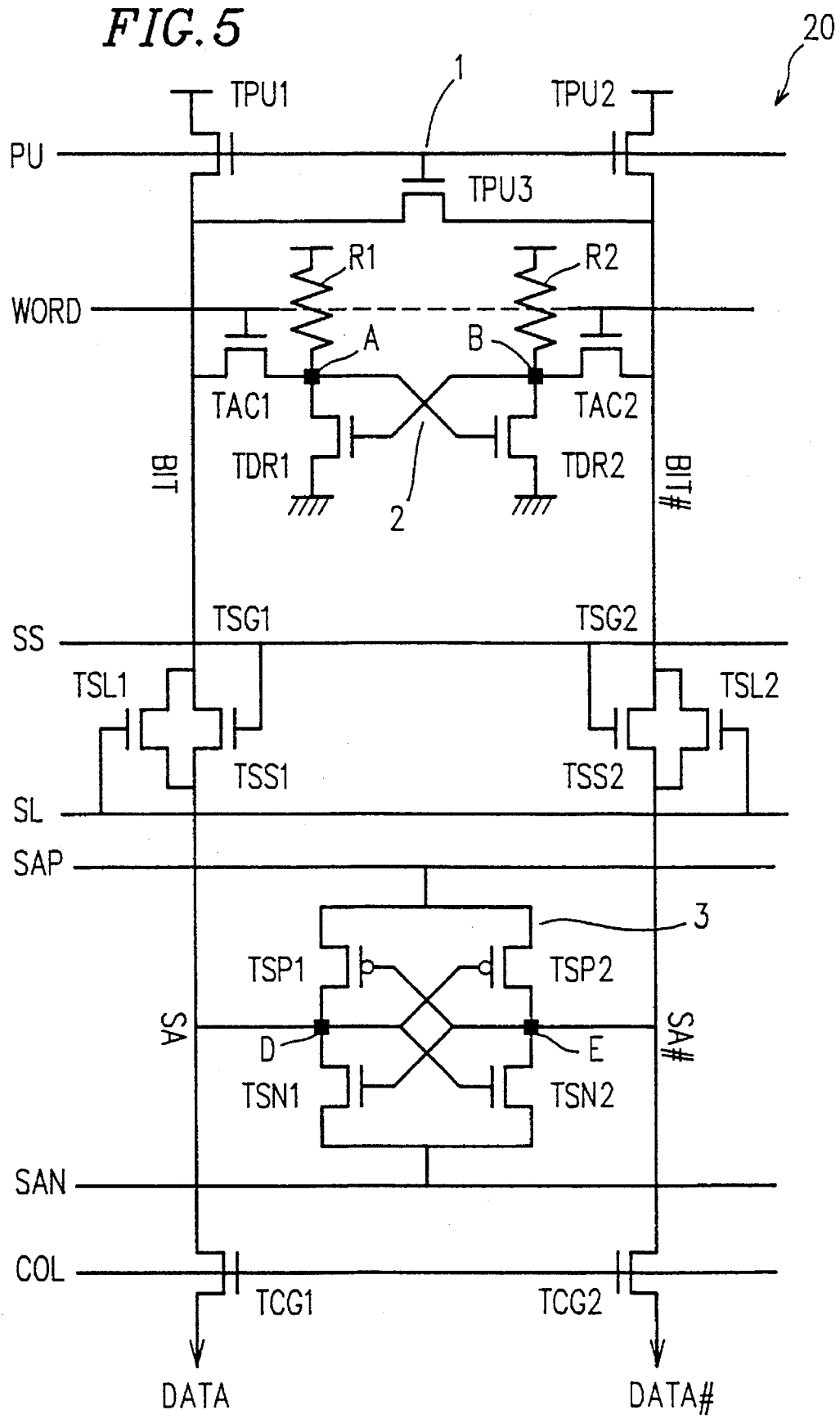
FIG. 5 is a circuit diagram of a MOS static memory device in accordance with a second example of the invention.

FIG. 5 is a circuit diagram of a MOS static memory device 20 in accordance with a second example of the invention.

The same reference numerals used in FIG. 2 are used to designate like components in FIG. 5, and therefore, a detailed description thereof has been omitted.

The device 20 of the second example is different from the device 10 of the first example in that the transfer gates TSG1 and TSG2 in the device 20 of the second example are constructed in such a manner that first transfer gates TSL1 and TSL2 with a lower ON resistance and second transfer gates TSS1 and TSS2 with a higher ON resistance are connected to each other in parallel. Accordingly, during the read sense operation, the second transfer gates TSS1 and TSS2 are turned ON, so that the bit line BIT and the bit-bar line BIT# are slightly supported by the sense amplifier 3.

For each pair of the bit line BIT and the bit-bar line BIT#, a sense amplifier 3 is provided. One terminal D of the sense amplifier 3 is connected to the bit line BIT via the first transfer gate TSL1 having the lower ON resistance and the second transfer gate TSS1 having the higher ON resistance. Similarly, the other terminal E of the sense amplifier 3 is connected to the bit-bar line BIT# via the first and the second transfer gates TSL2 and TSS2. Moreover, a control line SL is connected to each of the gates of the first transfer gates TSL1 and TSL2. A control line SS is connected to each of the gates of the second transfer gates TSS1 and TSS2.

The operation of the MOS static memory device 20 having the above-described structure in the second example will now be described.

Figure 6:
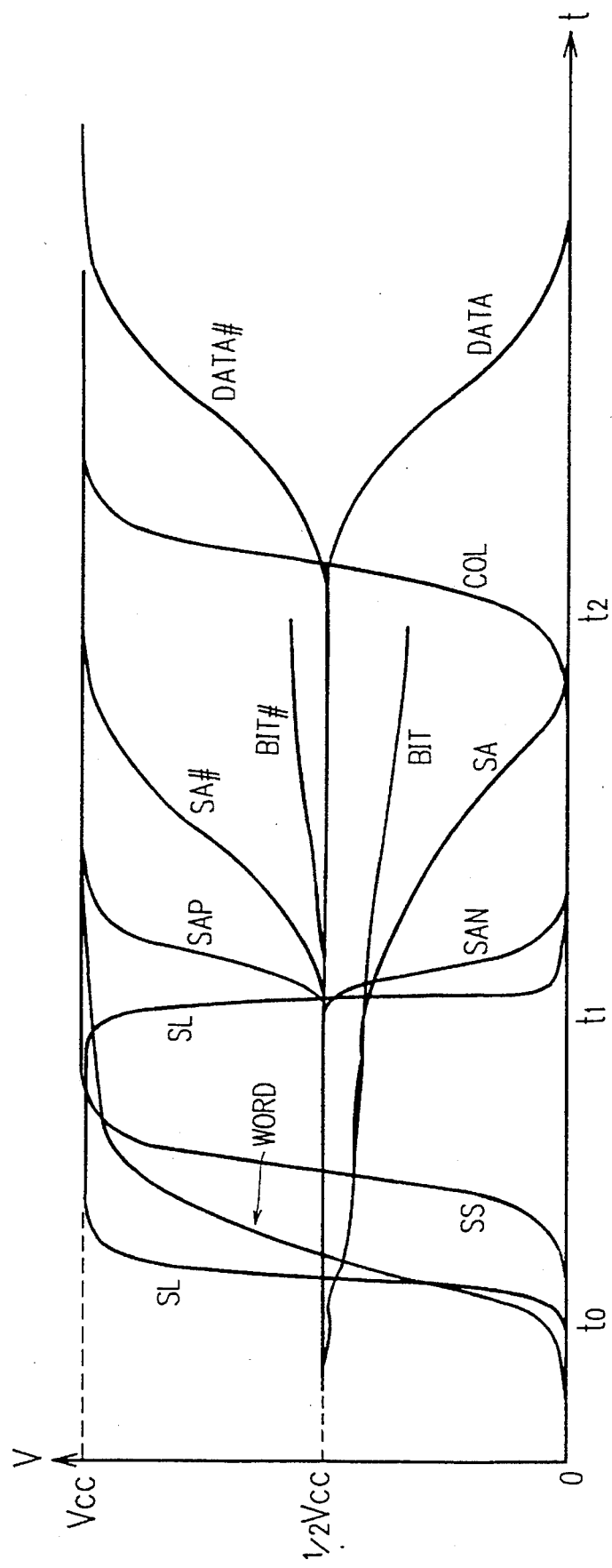
FIG. 6 is a timing diagram showing a read operation of the MOS static memory device shown in FIG. 5.

Referring to the timing diagram shown in FIG. 6, a read operation is first described. Lines in the figure are correspondingly labelled to indicate variations in potential of the respective lines and buses included in the circuit shown in FIG. 5 along a time axis, similar to the case in the first example.

First, at t=t_0, the potential of the control line SL is driven to rise to $V_{cc}$, and also the potential of the word line WORD is driven to rise toward $V_{cc}$. As a result, the access transistors TAC1 and TAC2 are turned ON, so that a potential difference is generated between the bit line BIT and the bit-bar line BIT# in accordance with data stored in the memory cell 2. At this time, the first transfer gates TSL1 and TSL2 with the lower ON resistance are both in the ON state. The sense amplifier 3 does not start its operation yet. Each of the second transfer gates TSS1 and TSS2 with the higher ON resistance can be set either in the ON state or in the OFF state.

After a short time, when a potential difference sufficient for sensing operation is generated at both ends of the sense amplifier 3, the potential of the control line SL is lowered to GND at t=t_1. As a result, the first transfer gates TSL1 and TSL2 are turned OFF, and the second transfer gates TSS1 and TSS2 are turned ON, so that the potential of the sense control line SAP and the potential of the sense control line SAN gradually change toward $V_{cc}$ and GND, respectively. Then, the sense amplifier 3 starts its sensing operation.

When the sensing operation by the sense amplifier 3 is finished and a large potential difference is generated between the lines SA and SA# at both ends of the sense amplifier 3 (t=t_2), the potential of the control line COL is driven to change toward $V_{cc}$. Thus, the column transfer gates TCG1 and TCG2 are turned ON. As a result, data is superimposed on the data bus DATA and the data-bar bus DATA#, so that the potentials of the respective data buses are caused to change.

As described above, in the MOS static memory device 20 of this example, the bit line BIT and the bit-bar line BIT# are driven by the sense amplifier 3 via the second transfer gates TSS1 and TSS2 with the higher ON resistance, respectively. Accordingly, as compared with the device 10 in the first example, the amount of the potential change of each of the bit line BIT and the bit-bar line BIT# is slightly increased, and hence the consumed power is somewhat increased. However, the bit line BIT and the bit-bar line BIT# are driven by the sense amplifier 3 of low impedance, so that the device 20 of this example has a resistance against memory destruction.

Figure 7A:
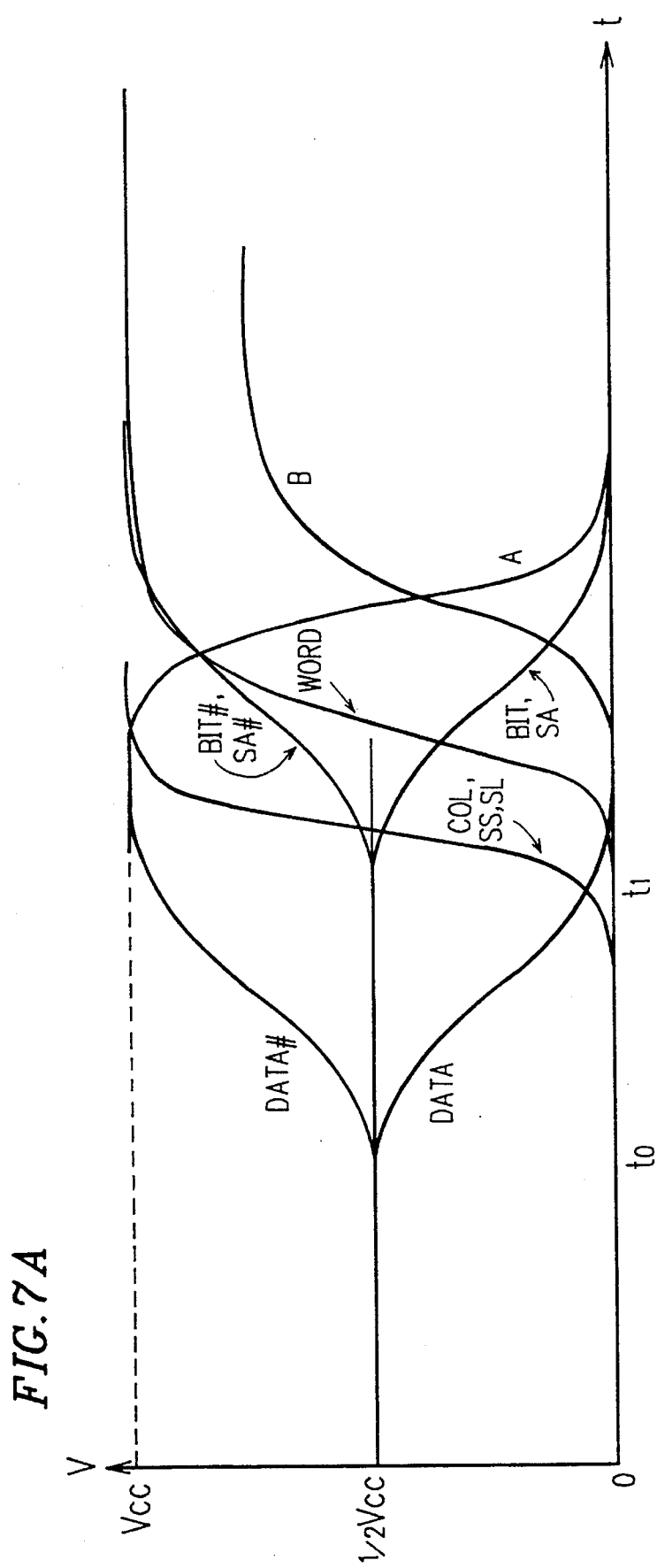
FIGS. 7A and 7B are timing diagrams showing a write operation of the MOS static memory device shown in FIG. 5.
Figure 7B:
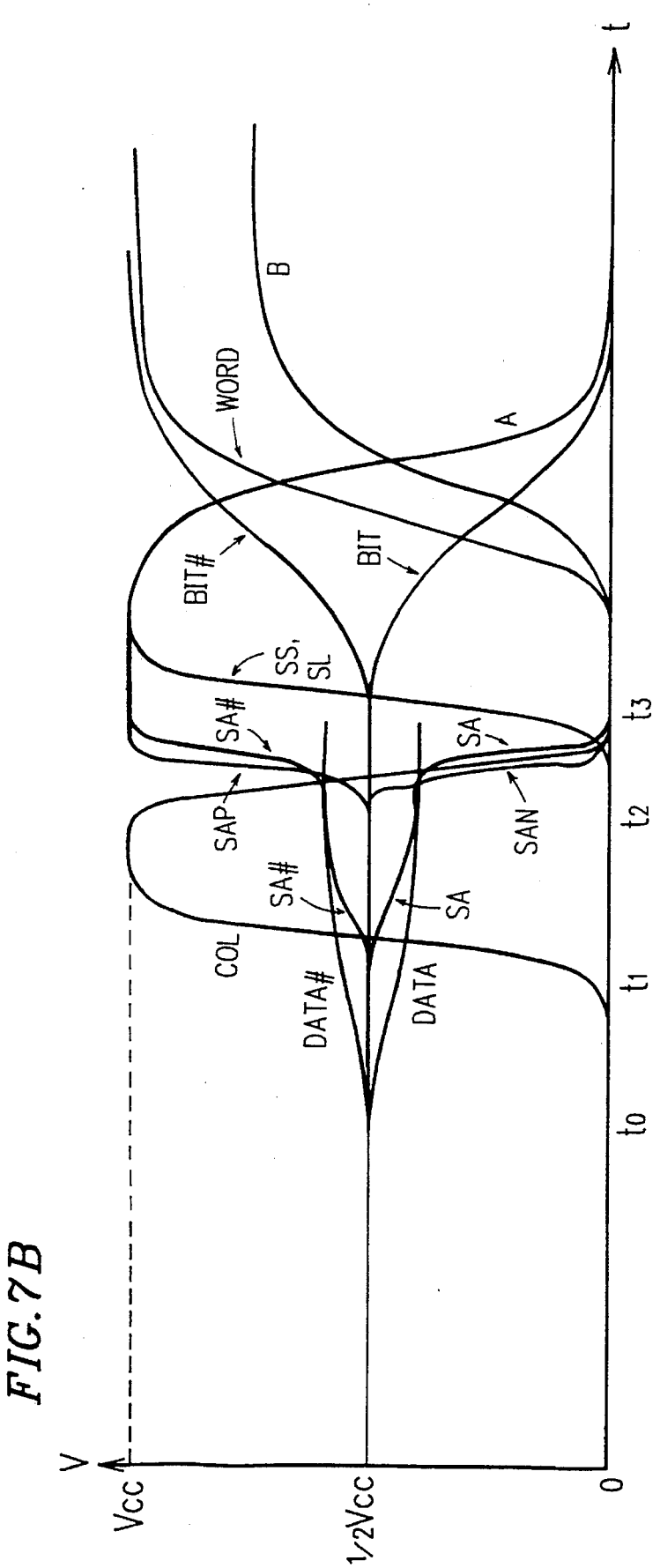

Next, referring to the timing diagrams shown in FIGS. 7A and 7B, a write operation will be described. In the same way, lines in the figures are correspondingly labelled to indicate variations in potential of the respective lines and buses included in the circuit shown in FIG. 5. Further, lines labelled as a and B in the figures indicate variations in potential at the nodes A and B shown in FIG. 5, which are changed as data is written into the memory cell 2.

As described in the first example, the write operation can be achieved without using the sense amplifier 3. The timing diagram in such a case is shown in FIG. 7A. The write operation in such a case is substantially the same as in the case which has been described with reference to FIG. 4A, so that the detailed description thereof is omitted. The difference between the first and the second examples is that the device 20 of the second example includes two control lines SS and SL instead of the control line SG in the first example, so that the potentials of the three control lines SS, SL, and COL begin to change toward $V_{cc}$ at $t=t_1$ in the second example.

However, when the sense amplifier 3 is operated, the write operation can be performed faster with lower power consumption, as in the first example. Referring to FIG. 7B, the low-power write operation will be described below.

At $t=t_0$, a small potential difference generated in accordance with the data to be stored is superimposed on the potentials of the data bus DATA and the data-bar bus DATA#. The potentials of the both buses DATA and DATA# are not made to full-swing. Next, at $t=t_1$, the potential of the control line COL is driven to rise to $V_{cc}$, so that the column transfer gates TCG1 and TCG2 are turned ON. As a result, the data are fed onto the sense line SA and the sense-bar line SA# at both ends of the sense amplifier 3, so that the potentials of the lines SA and SA# are caused to slightly change.

Next, when the potential difference sufficient for the sensing operation is generated at both ends of the sense amplifier 3 ($t=t_2$), the potential of the control line COL is driven to decrease toward GND, so that the column transfer gates TCG1 and TCG2 are turned OFF. As a result, the potential of the sense control line SAP and the potential of the sense control line SAN are changed toward $V_{cc}$ and GND, respectively. Then, the sensing operation of the sense amplifier 3 is started.

When the sensing operation is finished and the sufficiently large potential difference is produced at both ends of the sense amplifier 3, the transfer gates TSL1 and TSL2 between the bit line BIT and the sense amplifier 3 and between the bit-bar line BIT# and the sense amplifier 3 are turned ON, and the bit line BIT and the bit-bar line BIT# are driven. Then, the word line WORD is activated, whereby the data writing to the memory cell 2 is performed as indicated by the potential changes at the nodes A and B.

According to the above-explained write operation, the amount of the potential change of the data bus DATA and the data-bar bus DATA# is not so large, whereby the data can be written faster with lower power consumption.

Moreover, the circuitry shown in FIG. 5 exhibits a strong resistance against the interference between a bit line to which the write operation is performed and an adjacent bit line to which the read operation is performed, for the following reason.

In general, the bit line which is adjacent to the bit line to which the write operation is performed is in the read state. In a conventional memory device, the bit lines are supported by the memory cell and the pull-up of the bit line, and thus, only the memory cell supports the low level. Accordingly, in some cases, the memory destruction may occur. On the contrary, in the circuitry of the second example of the invention, the low level of the bit line is pulled not only by the memory cell but also by the sense amplifier 3. As a result, the circuitry exhibits a strong resistance against the interference.

As described above, in the MOS static memory device according to the invention, the transfer gates TSG1 and TSG2 are provided between the bit line BIT and the sense amplifier 3 and between the bit-bar line BIT# and the sense amplifier 3, respectively, whereby the bit line BIT and the bit-bar line BIT# are separated from the sense amplifier 3. In addition, during the operation, the sense amplifier 3 starts its sensing operation after the transfer gates TSG1 and TSG2 are turned OFF, so that the amount of the potential change of the bit line BIT and the bit-bar line BIT# is prevented from increasing. As a result, it is possible to obtain a sense amplifier having a smaller size and operating with lower power consumption.

Alternatively, instead of the transfer gates TSG1 and TSG2, the first transfer gates TSL1 and TSL2 with a lower ON resistance and the second transfer gates TSS1 and TSS2 with a higher ON resistance are connected in parallel. When the second transfer gates TSS1 and TSS2 are in the ON state, the bit line BIT and the bit-bar line BIT# are slightly supported by the sense amplifier 3. Therefore, it is possible to obtain a sense amplifier which has a smaller size and a resistance against the bit-line interference.

Figure 1:
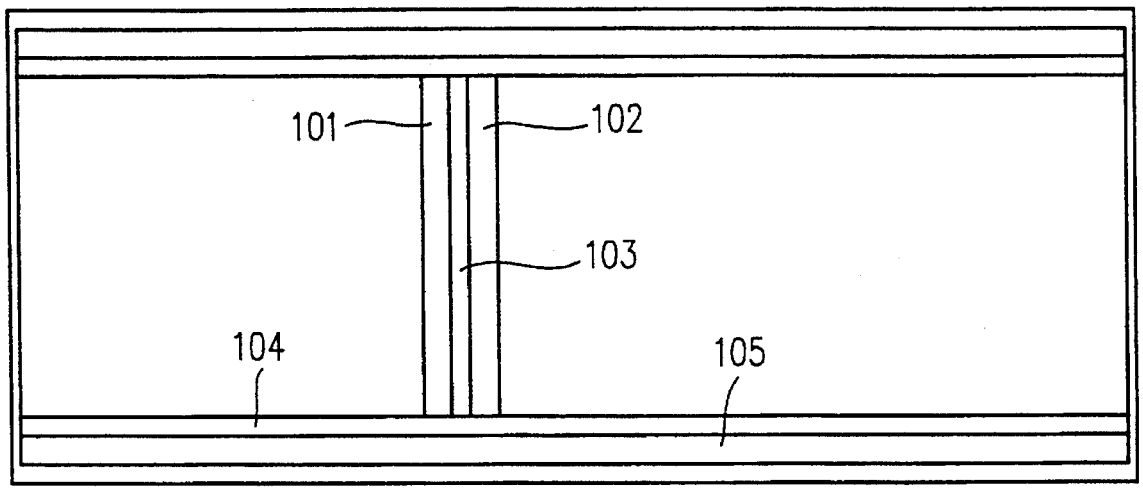
FIG. 1 is a diagram schematically showing the structure of a conventional 4-Mbits SRAM chip.

It will be appreciated that the memory device according to the present invention can consist of a plurality of the individual cells identical to that shown in FIGS. 1 and 2, for example. In addition, it will be appreciated that the memory device of the present invention may include other appropriate control circuitry for controlling the aforementioned operation thereof.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A MOS static memory device comprising:

a bit-line pair to which the memory cell is connected, the bit-line pair comprising a bit line and a bit-bar line;

a sense amplifier;

a data bus and data-bar bus;

first transfer gates respectively provided between a first terminal of the sense amplifier and the bit line and between a second terminal of the sense amplifier and the bit-bar line;

second transfer gates respectively provided between the first terminal of the sense amplifier and the data bus and between the second terminal of the sense amplifier and the data-bar bus; and control means connected to the first transfer gates and the second transfer gates for controlling the operation thereof whereby during a read operation of the MOS static memory device, the sense amplifier starts a sensing operation after the first transfer gates are turned OFF, and wherein during a write operation of the MOS static memory device, the control means is operative for controlling the first transfer gates and the second transfer gates whereby the sense amplifier starts the sensing operation after the second transfer gates are turned OFF.

2. A MOS static memory device comprising:

a bit-line pair to which a memory cell is connected, the bit-line pair comprising a bit lien and a bit-bar line;

a sense amplifier;

a data bus and a data-bar bus;

parallel circuits respectively including a first transfer gate with a low ON resistance and a second transfer gate with a high ON resistance, the parallel circuits being provided respectively between a first terminal of the sense amplifier and the bit line and between a second terminal of the sense amplifier and the bit-bar line;

third transfer gates respectively provided between the first terminal of the sense amplifier and the data bus and between the second terminal of the sense amplifier and the data-bar bus; and control means connected to the first transfer gates, the second transfer gates and the third transfer gates for controlling the operation thereof whereby during a read operation of the MOS static memory device, the sense amplifier starts a sensing operation after the respective first transfer gates are turned OFF, wherein said control means includes a first control line connected to a gate of each of the first transfer gates, a second control line connected to a gate of each of the second transfer gates and a third control line connected to a gate of each of the third transfer gates.

3. A MOS static memory device according to claim 2, wherein during a write operation of the MOS static memory device, the control means is operative for controlling the first transfer gates, the second transfer gates and the third transfer gates whereby the sense amplifier starts the sensing operation after the third transfer gates are turned OFF.

4. A MOS static memory device according to claim 1, wherein said control means includes a first control line connected to a gate of each of the first transfer gates and a second control line connected to a gate of each of the second transfer gates.

5. A MOS static memory device comprising:

a bit-line pair to which a memory cell is connected, the bit line pair comprising a bit line and a bit-bar line;

a sense amplifier;

a data bus and a data-bar bus;

first transfer gates respectively provided between a first terminal of the sense amplifier and the bit line and between a second terminal of the sense amplifier and the bit-bar line;

second transfer gates respectively provided between the first terminal of the sense amplifier and the data bus and between the second terminal of the sense amplifier and the data-bar bus; and control means connected to the first transfer gates and the second transfer gates for controlling the operation thereof whereby during a read operation of the MOS static memory device, the sense amplifier starts a sensing operation after the transfer gate are turned OFF, wherein during a write operation of the MOS static memory device, a potential level of the data bus and a potential level of the data-bar bus respectively change within a predetermined range, an upper limit of the predetermined range being lower than Vcc level and a lower limit of the predetermined range being higher than GND level.

6. A MOS static memory device according to claim 2, wherein during a write operation of the MOS static memory device, a potential level of the data bus and a potential level of the data-bar bus respectively change within a predetermined range, an upper limit of the predetermined range being lower than Vcc level and a lower limit of the predetermined range being higher than GND level.

7. A MOS static memory device according to claim 1, wherein during the read operation of the MOS static memory device, a potential level of the bit line and a potential level of the bit-bar line, respectively, change within a predetermined range, an upper limit of the predetermined range being lower than Vcc level and a lower limit of the predetermined range being higher than GND level.

* * * * *